(12) United States Patent
Hause et al.

(10) Patent No.: US 7,741,663 B2
(45) Date of Patent: Jun. 22, 2010

(54) AIR GAP SPACER FORMATION

(75) Inventors: Fred Hause, Austin, TX (US); Anthony C. Mowry, Buda, TX (US); David G. Farber, Austin, TX (US); Markus E. Lenski, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/258,188

(22) Filed: Oct. 24, 2008

(65) Prior Publication Data

US 2010/0102363 A1   Apr. 29, 2010

(51) Int. Cl.
*H01L 29/772* (2006.01)
*H01L 21/336* (2006.01)

(52) U.S. Cl. ............... 257/288; 257/900; 257/E21.409; 257/E29.255; 438/300; 438/303; 438/421; 438/422; 438/595

(58) Field of Classification Search ................. 438/299, 438/300, 303, 421, 422, 595; 257/288, 900, 257/E21.409, E29.255
See application file for complete search history.

(56) References Cited

U.S. PATENT DOCUMENTS

| 5,417,056 | A  | * | 5/1995 | Johnson et al. | ............... | 60/260 |
| 5,770,507 | A  | * | 6/1998 | Chen et al. | ................... | 438/305 |
| 5,923,980 | A  | * | 7/1999 | Gardner et al. | .............. | 438/270 |
| 5,937,299 | A  | * | 8/1999 | Michael et al. | ............. | 438/299 |
| 6,124,177 | A  | * | 9/2000 | Lin et al. | ..................... | 438/305 |
| 6,127,712 | A  | * | 10/2000 | Wu | ............................. | 257/410 |
| 6,197,645 | B1 | * | 3/2001 | Michael et al. | ............. | 438/300 |
| 6,468,877 | B1 | * | 10/2002 | Pradeep et al. | .............. | 438/421 |
| 6,495,447 | B1 |  | 12/2002 | Okada et al. |  |  |
| 6,596,599 | B1 | * | 7/2003 | Guo | ........................... | 438/305 |
| 6,764,912 | B1 |  | 7/2004 | Foster et al. |  |  |
| 6,784,095 | B1 |  | 8/2004 | Pangrle et al. |  |  |
| 6,894,357 | B2 | * | 5/2005 | Guo | ........................... | 257/410 |
| 2001/0014533 | A1 | * | 8/2001 | Sun | ............................. | 438/655 |
| 2003/0211684 | A1 | * | 11/2003 | Guo | ........................... | 438/230 |
| 2005/0006712 | A1 |  | 1/2005 | Ngo et al. |  |  |
| 2005/0124151 | A1 | * | 6/2005 | Cheng et al. | ................ | 438/623 |

* cited by examiner

*Primary Examiner*—Mary Wilczewski
(74) *Attorney, Agent, or Firm*—Ditthavong, Mori & Steiner, P.C.

(57) ABSTRACT

Miniaturized complex transistor devices are formed with reduced leakage and reduced miller capacitance. Embodiments include transistors having reduced capacitance between the gate electrode and source/drain contact, as by utilizing a low-K dielectric constant sidewall spacer material. An embodiment includes forming a gate electrode on a semiconductor substrate, forming a sidewall spacer on the side surfaces of the gate electrode, forming source/drain regions by ion implantation, forming an interlayer dielectric over the gate electrode, sidewall spacers, and substrate, and forming a source/drain contact through the interlayer dielectric. The sidewall spacers and interlayer dielectric are then removed. A dielectric material, such as a low-K dielectric material, is then deposited in the gap between the gate electrode and the source/drain contact so that an air gap is formed, thereby reducing the parasitic "miller" capacitance.

20 Claims, 4 Drawing Sheets

AIR GAP SPACER FORMATION

TECHNICAL FIELD

The present disclosure relates to miniaturized transistor devices with reduced parasitic parameters. The present disclosure is particularly applicable to complex transistor devices with reduced leakage and reduced miller capacitance.

BACKGROUND

FIG. 1 illustrates a typical conventional transistor device 100 comprising a semiconductor substrate 101, a gate electrode 103, source/drain regions 105, sidewall spacers 107, and source/drain contact 109. The gate electrode 103 is formed on the surface of semiconductor substrate 101 and typically includes a thin silicon dioxide layer 111 and a polysilicon layer 113. Sidewall spacers 107 are formed on the side surfaces of the gate electrode and block implants when forming source/drain regions 105.

As the dimensions of transistor devices continue to shrink, parasitic parameters that were previously considered benign now adversely affect the performance of the transistor and the circuit in which it is used. Among these parameters is the miller capacitance, which is used to describe the capacitance 115 formed between a transistor's gate electrode 103 and the contact 109 to the transistor's source/drain region 105. Current technology produces transistor devices with a miller capacitance of 0.26-0.3 femtoFarads. The reduction of design features makes it highly desirable to reduce the miller capacitance down to 0.18-0.23 femtoFarads.

Nitrides, such as silicon nitride, are conventionally employed as sidewall spacers, and typically have a dielectric constant of about 6 to 7, with the dielectric constant of air being 1. The miller capacitance is heavily dependent upon the dielectric constant of the spacer material. The lower the dielectric constant of the spacer material, the lower the miller capacitance.

Oxides, such as silicon oxide, typically have a dielectric constant of about 3.9 to 4.2, and have been previously employed as spacers. However, oxide spacers have proven problematic in limiting the process flow for forming complex transistors. For example, oxide spacers severely limit the formation of multiple implants, formation of complex spacer structures, and effective utilization of etch selectivity with other films in the circuit. Therefore, silicon nitride has become the material of choice for sidewall spacers. However, the use of silicon nitride spacers prevents effective reduction of the miller capacitance.

A need therefore exists for spacer formation technology enabling the formation of complex transistors without adversely impacting process flow.

SUMMARY

An aspect of the present disclosure is a semiconductor device comprising a transistor with reduced miller capacitance and reduced leakage.

Another aspect of the present disclosure is an efficient method of fabricating a semiconductor device comprising a transistor with reduced miller capacitance and reduced leakage.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a gate electrode on a substrate, forming a sidewall spacer on side surfaces of the gate electrode, forming a source/drain contact adjacent the a sidewall spacer, removing the sidewall spacer from between the gate electrode and source/drain contact, and depositing a dielectric material under conditions to achieve low step coverage between the gate electrode and source/drain contact to form an air gap between the gate electrode and the contact.

Aspects of the present disclosure include forming an inter level dielectric before forming the source/drain contact and removing both the sidewall spacers and inter level dielectric before depositing a low-K dielectric material under conditions controlled to form the air gap. Aspects also include forming the sidewall spacers from a silicon nitride, and depositing the dielectric material at a deposition rate greater than about 750 nanometers per minute, a pressure greater than about 100 mT, an RF power frequency less than about 25 W, and a temperature less than about 275 C.°. Aspects further include controlling deposition conditions to form the air gap at a thickness greater than the thickness of the inter level dielectric divided by the dielectric constant of the inter level dielectric layer.

Another aspect of the present disclosure is a transistor device comprising: a gate electrode, a source/drain contact spaced apart from the poly gate electrode, an inter level dielectric over the gate electrode, the source/drain contact, and partially between the gate electrode and source/drain contact, and an air gap between the gate electrode and the source/drain contact.

Aspects include transistors wherein the source/drain contact is spaced apart from the gate electrode at a distance of about 150 Å, such as about 75 Å, e.g., about 60 Å, and forming the inter level dielectric from a low-K material, such as carbon doped silicon dioxide.

Another aspect of the present disclosure is a method of fabricating a semiconductor device, the method comprising: forming a gate electrode and source/drain contact spaced apart from the gate electrode over a substrate; forming a sidewall spacer on a side surface of the gate electrode; depositing a layer of dielectric material so that the space between the gate electrode and source/drain contact is occupied by the sidewall spacer and dielectric material having a combined dielectric constant $K^1$; removing the sidewall spacer and dielectric material from between the gate electrode and source/drain contact; and depositing a dielectric material between the gate electrode and source/drain contact while controlling depositions to form an air gap between the gate electrode and source/drain contact, such that the dielectric material and air gap have a combined dielectric constant $K^2$ less than $K^1$. For example, the dielectric material can be deposited while controlling depositions such that $K^2$ is less than $K^1$ by about 10% to about 75%.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
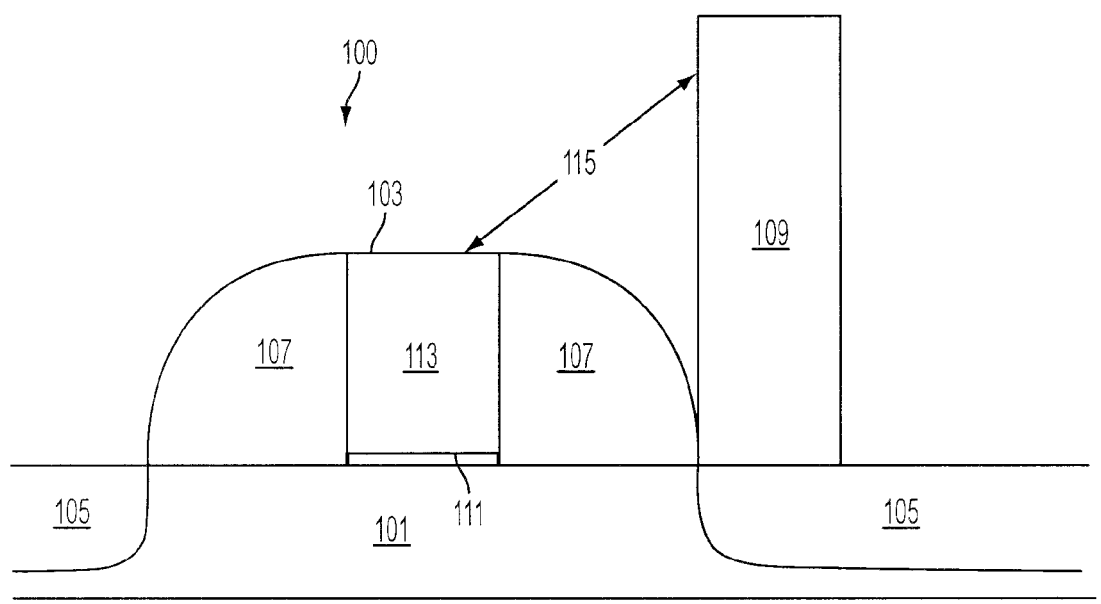
FIG. 1 schematically illustrates a conventional transistor device.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves leakage and parasitic capacitance problems, such as the increased miller capacitance problem, which adversely affect transistor performance, as the design features continue to shrink, as in transistors wherein the distance between the gate electrode and source/drain contact plunges to less than 150 Å, such as less than 75 Å, e.g., less than 60 Å. In accordance with embodiments of the present disclosure, a transistor device is provided having reduced capacitance between the gate electrode and the source/drain contact using methodology that does not adversely impact process flow. In accordance with embodiments of the present disclosure, the capacitance between the gate electrode and source/drain contact is reduced by lowering the dielectric constant between the gate electrode and source/drain contact, as by forming an air gap in that area and/or providing a low-K dielectric material therein, thereby reducing the miller capacitance and reducing leakage.

Embodiments of the present disclosure include forming a transistor device having reduced miller capacitance and reduced leakage by initially forming sidewall spacers and an inter level dielectric from a material that is highly conducive to process flow, e.g., a silicon nitride. In this way issues relating to multiple implants, complex spacer formation, and etch selectivity are avoided. Subsequently, the initially formed sidewall spacers and inter level dielectric are removed. In an embodiment of the present disclosure, a dielectric material, such as a low-K material, is subsequently deposited. During such deposition, conditions are controlled to achieve low step coverage to encourage what is known as "bread loafing", such that the dielectric material is deposited on top corner features at a thickness greater that the thickness of the dielectric material deposited on the bottom of the structural feature. As deposition proceeds the thicker portions of dielectric material at the top corners of features form pinch points that shadow the bottom portion of the features thereby preventing dielectric deposition to occur at the bottom. When the pinch points come together an air gap is formed in the region between the gate electrode and source/drain contact thereby reducing capacitance in that area. Consequently, transistor and circuit performance are significantly improved.

Methodology in accordance with embodiments of the present disclosure includes forming a gate electrode on a substrate, forming a sidewall spacer on opposite side surfaces of the gate electrode, depositing an inter level dielectric layer over the gate electrode and the spacers. Depending on the thickness of the deposited inter level dielectric, planarization may be implemented, e.g., by chemical mechanical polishing (CMP), in a conventional manner. The spacer may be a material having a dielectric constant between 4 and 7, for example a silicon nitride. A source/drain contact and gate contact, e.g., tungsten, are subsequently formed. In accordance with embodiments of the present disclosure, the source/drain contact is spaced from the gate electrode less than about 150 Å, such as less than about 75 Å, e.g., less than about 60 Å. At such small distances the miller capacitance adversely impacts transistor and circuit performance. In accordance with embodiments of the present disclosure, the initially formed sidewall spacer adjacent the source/drain contact and the inter level dielectric layer are removed, as by etching. A dielectric material with low step coverage is then formed over the gate electrode, the source/drain contact, and the space in between. The dielectric material may be a silicon oxide. The dielectric material may also be a low-K material with a dielectric constant less than or equal to about 4.2, such as carbon doped silicon dioxide. Because of the low step coverage, the dielectric material forms an air gap spacer between the gate electrode and the contact. During deposition, conditions are controlled to form the air gap at a suitable size. For example, deposition conditions can be controlled to form the air gap at a thickness greater than the thickness of the inter level dielectric divided by the dielectric constant of the inter level dielectric.

The inter level dielectric may be deposited by plasma enhanced chemical vapor deposition (PECVD). The deposition rate, pressure, RF power frequency, and temperature each contributes to the formation of the air gap. Such deposition conditions may be controlled to achieve low step coverage to form pinch points on the upper portions of the features, e.g., source/drain contact and gate electrode, to form the air gap. Suitable deposition conditions may be controlled to yield a deposition rate greater than about 750 nanometers per minute, e.g., a pressure greater than about 100 mT, an RF power frequency less than about 25 W, and a temperature less than about 275 C.°.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
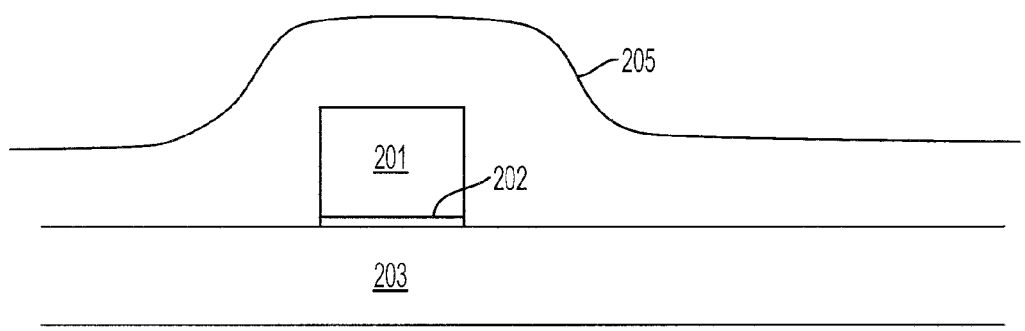
FIGS. 2A through 2F schematically illustrate sequential steps of a method in accordance with an embodiment of the present disclosure.
Figure 2B:
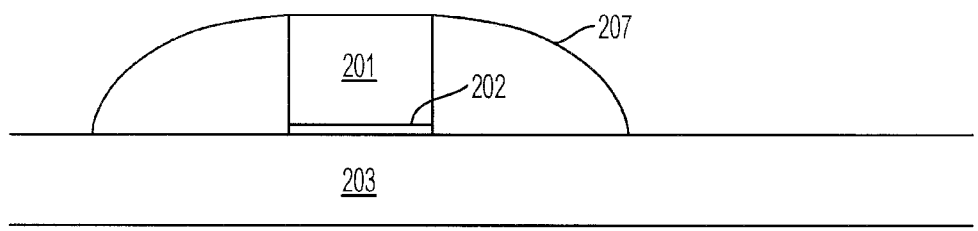

A method in accordance with an embodiment of the present disclosure is schematically illustrated in FIGS. 2A through 2F, wherein like reference characters denote like features. Adverting to FIG. 2A, gate electrode 201, typically polysilicon, is formed on a semiconductor substrate 203 with gate dielectric layer 202, such as silicon oxide, formed therebetween. Embodiments of the present disclosure include forming lightly doped source/drain regions using the gate electrode as a mask in a conventional manner, but not shown for illustrative convenience. Dielectric layer 205 is then deposited over gate electrode 201 and substrate 203. Dielectric layer 205 may be formed of a material with a high dielectric constant K, for example with a dielectric constant K in the range of 4 to 7, such as a silicon nitride to avoid adversely impacting process flow as in forming multiple implants, and selectively etching. Layer 205 is anisotropically etched to form sidewall spacers 207, as shown in FIG. 2B. During anisotropic etching, silicon nitride is removed from the upper surface of the gate electrode and the surface of the semiconductor substrate, to form sidewall spacers 207 on side surfaces of gate electrode 201. In accordance with embodiments of the present disclosure, sidewall spacers can be advantageously formed with a reduced thickness of less than about 150 Å, such as less than about 75 Å, e.g., less than about 60 Å.

Figure 2C:
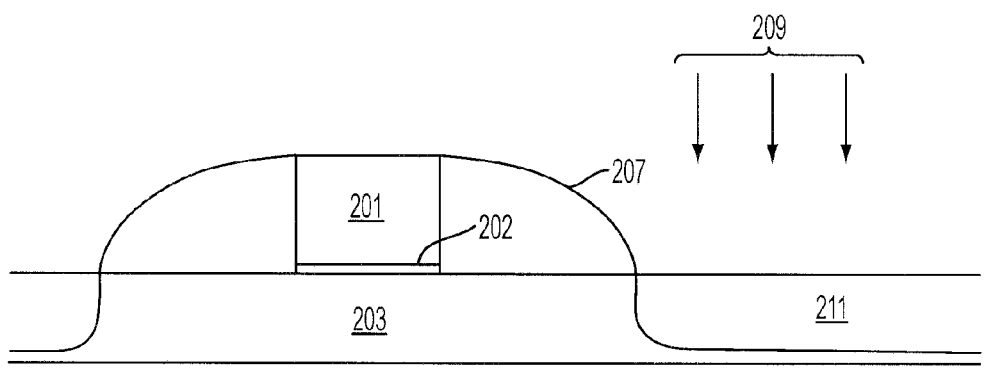

Subsequently, heavily doped source/drain regions 211 are formed in semiconductor substrate 203 using gate electrode 201 and sidewall spacers 207 as a mask, employing conventional implantation techniques, as by ion implanting 209 boron, phosphorus, or arsenic, as illustrated in FIG. 2C.

Figure 2D:
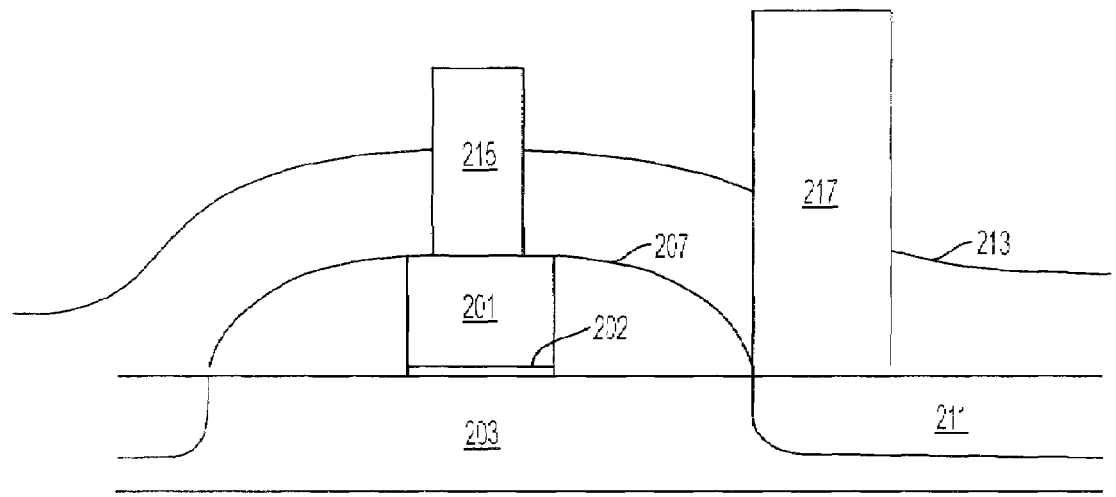

As shown in FIG. 2D, after source/drain regions 211 are formed, a temporary inter level dielectric (ILD) 213 is deposited over gate electrode 201, sidewall spacers 207, and source/drain regions 211. Temporary ILD 213 may be formed, for example, of a nitride, an oxide, or phosphosilicate glass (PSG) by any known deposition method, such as physical vapor deposition (PVD), chemical vapor deposition (CVD), electrochemical deposition (ECD), or molecular beam epitaxy (MBE), among others. The temporary ILD 213 is typically formed using a high step coverage film deposition in typical flow to ensure void free formation. Contact holes are then formed in the temporary ILD 213 down to the gate 201 and source or drain region 211 using, for example, wet etching or dry etching. Gate electrode contact 215 and source/drain contact 217 are formed by depositing in the contact holes a conductive material such as tungsten, a combination of platinum and tungsten, or carbon nanotubes.

Figure 2E:
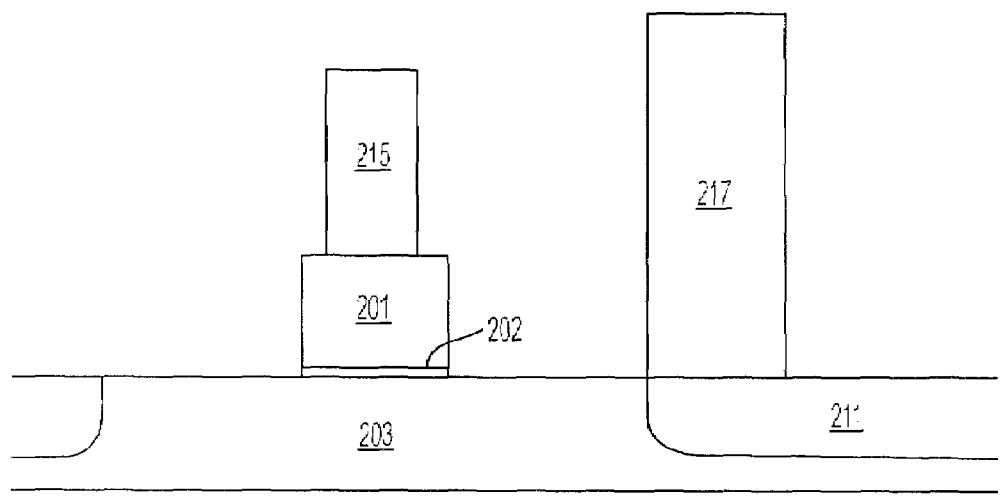

After contacts 215 and 217 are formed, temporary ILD 213 and sidewall spacers 207 are removed, resulting in the intermediate structure illustrated in FIG. 2E. Such removal can be effected by selective etching maintaining selectivity to the gate electrode 201, the contact structures 215 and 217, the source/drain regions 211, and isolation regions (not shown for illustrative convenience).

Figure 2F:
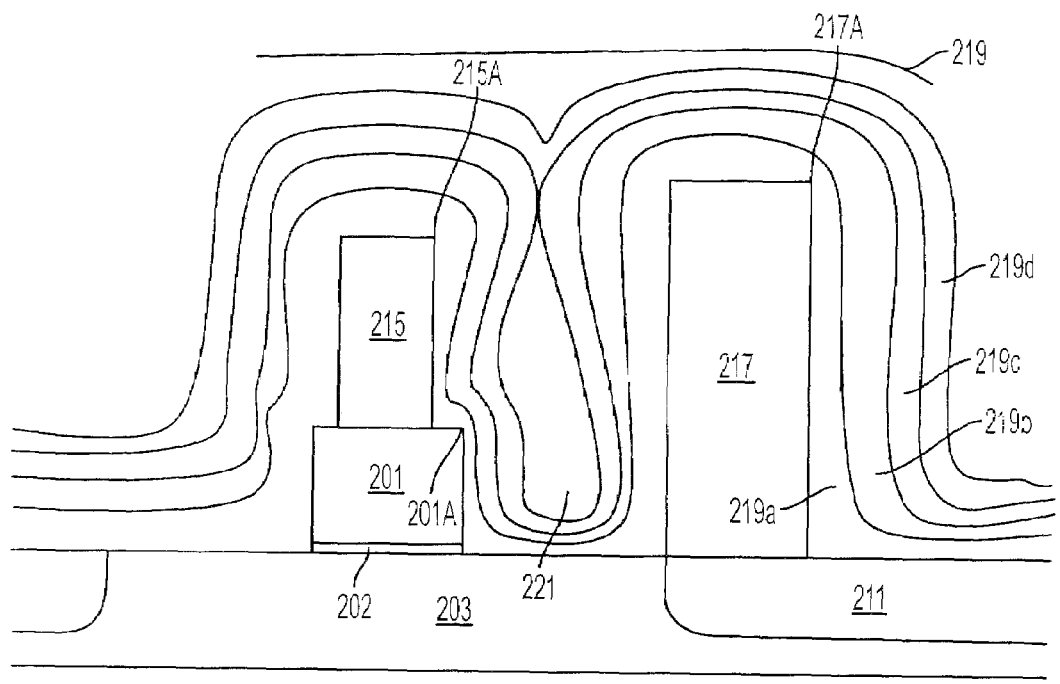

In FIG. 2F, a non-conformal inter level dielectric layer 219 is deposited, such as an oxide. Embodiments also include depositing a low-K material. During deposition, conditions are controlled to purposefully achieve low or poor step coverage over contacts 215 and 217, gate electrode 201, and semiconductor substrate 203. Suitable materials for the low-K dielectric ILD layers 219 include, but are not limited to, carbon doped silicon dioxide such as Black Diamond from Applied Materials, Aurora from ASM International N.V., and Coral by Novellus Systems. By doping silicon dioxide with carbon, the dielectric constant can be lowered to 3.0. Other suitable materials for the low-K dielectric ILD layers 219 include spin-on polymeric dielectrics, such as SiLK from Dow Chemical and others traditionally used to deposit a photoresist, rather than CVD. Integration difficulties with these spin-on polymeric dielectric materials include low mechanical strength and thermal stability. Other spin-on organic low-K materials include polyimide, polynorbornenes, Benzocyclobutene, and PTFE.

The dielectric material for layer 219 should be amenable to being deposited with low step coverage to encourage "bread loafing" such that as the ILD layer is deposited, the thickness of the deposited material over the top corners 215A, 201A, and 217A of gate contact 215, gate electrode 201, and source/drain contact 217, respectively, is greater than the thickness of the deposited material closer to the bottom of such features. As deposition proceeds, illustrated by the progression $219_a$ through $219_d$, the thicker portions form "pinch points" that shadow the bottom features, thereby preventing dielectric deposition at the bottom of the features. The "pinch points" eventually come together, sealing off the bottom, forming an air gap 221, and isolating the contact and gate electrode, thereby reducing capacitance between those features. Suitable source gases amenable to bread loafing include any source gas with a low surface mobility of the reactants. For example, silane-based plasma enhanced chemical vapor deposition (PECVD) films other than tetraethylorthosilicate (TEOS) may be used for the ILD deposition.

Figure 3:
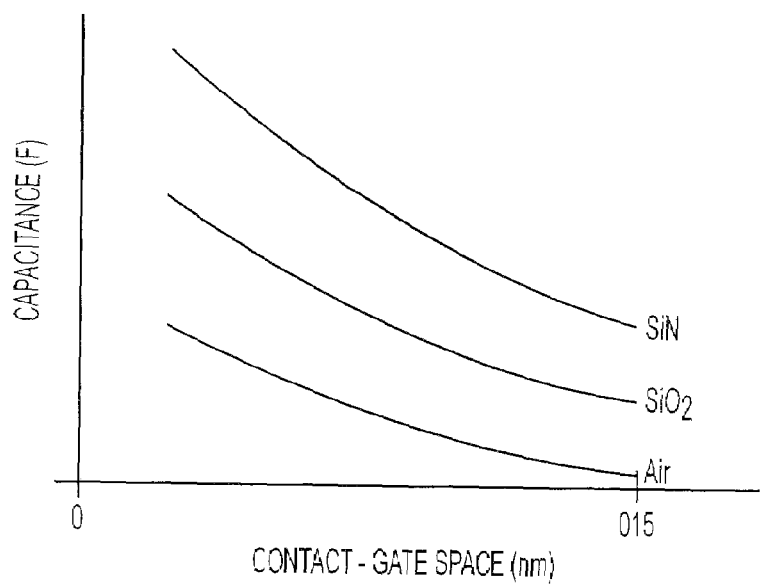
FIG. 3 is a schematic representation of the relationship between contact to gate spacing and capacitance for air, silicon dioxide, and silicon nitride.

Since layer 219 and the air in air gap 221 will form a series capacitor, the capacitance is inversely proportional to the thickness considered laterally between the gate electrode and source/drain contact. In FIG. 3 the relative relationships between source/drain contact to gate electrode spacing and capacitance for air, silicon dioxide, and silicon nitride are schematically illustrated. Since air has a dielectric constant of 1, silicon dioxide has a dielectric constant of about 3.9 to about 4.2, and silicon nitride has a dielectric constant of about 6 to about 7, for any given source/drain contact to gate electrode spacing, the capacitance for an air gap spacer is the lowest, and the capacitance for a silicon nitride spacer is the highest. The capacitance for a spacer as shown in FIG. 2F (of combined dielectric material and air gap 221) will always be the lower of the two capacitances of ILD layers 219 and air gap 221. In other words, the thickness of the air gap should be greater than the thickness of the ILD material divided by the ILD dielectric constant to take advantage of the air's dielectric constant, thereby having a capacitance value less than that of the ILD by itself. It was found that the volume of the air gap between the gate electrode and the source/drain contact can be varied between about 10% to about 75% to optimize capacitance reduction.

The dielectric material to form layer 219 can be deposited using chemical vapor deposition (CVD), such as plasma enhanced chemical vapor deposition (PECVD), while controlling deposition conditions to achieve poor step coverage and bread loafing. For example, several parameters, such as deposition rate, pressure, RF power, and temperature, can be strategically manipulated. Embodiments of the present disclosure include depositing the dielectric material at a high deposition rate, such as greater than 750 nanometers per minute, to induce bread loafing. Also, high pressure, such as greater than 100 mT, and low frequency RF power, such as less than 25 W, are useful for provoking bread loafing. Low temperature processes, for example under 275 C.°, also increase bread loafing. It should be noted that physical gas species (i.e., Argon) and etchants (i.e., $SiCl_4$) tend to decrease bread loafing through a deposition/etch process and, therefore, should be avoided. The various process parameters can be adjusted to optimize the size of the air gap spacer.

The embodiments of the present disclosure can achieve several technical effects, including leakage reduction, reduced miller capacitance, improved transistor and circuit performance, and reduced power requirements. The present disclosure enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a gate electrode on a substrate,
    forming a sidewall spacer on side surfaces of the gate electrode,
    forming a source/drain contact adjacent the sidewall spacer,
    removing the sidewall spacer from between the gate electrode and source/drain contact, and
    depositing a dielectric material under conditions to achieve low step coverage between the gate electrode and the source/drain contact to form an air gap between the gate electrode and the contact.

2. The method according to claim 1, wherein the dielectric material has a dielectric constant (k) not greater than about 4.2.

3. The method according to claim 1, further comprising forming an inter level dielectric before forming the source/drain contact.

4. The method according to claim 3, further comprising removing the inter level dielectric before depositing the dielectric material to form the air gap.

5. The method according to claim 1, comprising forming the sidewall spacer with a material having a dielectric constant between about 4 and about 7.

6. The method according to claim 5, wherein the material comprises silicon nitride.

7. The method according to claim 1, comprising depositing the dielectric material by plasma enhanced chemical vapor deposition (PECVD).

8. The method according to claim 7, comprising depositing the dielectric material at a deposition rate greater than about 750 nanometers per minute.

9. The method according to claim 8, comprising depositing the dielectric material at a pressure greater than about 100 mT.

10. The method according to claim 8, comprising depositing the dielectric material at an RF power frequency less than about 25 W.

11. The method according to claim 8, comprising depositing the dielectric material at a temperature less than about 275 C.°.

12. A transistor device comprising:
    a gate electrode,
    a source/drain contact spaced apart from the gate electrode,
    an inter level dielectric having low step coverage over the gate electrode, the source/drain contact, and partially between the gate electrode and source/drain contact, and
    an air gap, surrounded by the inter level dielectric, between the gate electrode and the source/drain contact.

13. The transistor device according to claim 12, wherein the inter level dielectric comprises an oxide or a material having a dielectric constant (K) not greater than about 4.2.

14. The transistor device according to claim 13, wherein the inter lever dielectric comprises carbon doped silicon dioxide.

15. The transistor device according to claim 12, wherein the source/drain contact is spaced apart from the gate electrode by less than about 150 Å.

16. The transistor device according to claim 15, wherein the source/drain contact is spaced from the gate electrode less than about 75 Å.

17. The transistor device as recited in claim 16, wherein the source/drain contact is spaced from the gate electrode less than about 60 Å.

18. The transistor device according to claim 12, wherein the air gap has a thickness greater than a thickness of the inter level dielectric divided by the dielectric constant of the inter level dielectric.

19. A method of fabricating a semiconductor device, the method comprising:
    forming a gate electrode and source/drain contact spaced apart from the gate electrode over a substrate;
    forming a sidewall spacer on a side surface of the gate electrode and depositing a layer of dielectric material so that the space between the gate electrode and source/drain contact is occupied by the sidewall spacer and dielectric material having combined dielectric constant $K^1$;
    removing the sidewall spacer and dielectric material from between the gate electrode and source/drain contact; and
    depositing a dielectric material between the gate electrode and source/drain material and controlling deposition conditions to form an air gap between the gate electrode and source/drain contact such the dielectric material and air gap have a combined dielectric constant $K^2$ less than $K^1$.

20. The method according to claim 19, comprising controlling the deposition conditions such that $K^2$ is less than $K^1$ by about 10% to about 75%.

* * * * *